United States Patent
Diebel et al.

[11] Patent Number: 6,067,223
[45] Date of Patent: May 23, 2000

[54] COOLER FOR FITTING TO THE REAR OR SIDE WALL OR THE DOOR OF A SWITCHING CABINET

[75] Inventors: Michael Diebel; Achim Edelmann, both of Dillenburg; Walter Nicolai, Buseck; Heinrich Strackbein, Biebertal, all of Germany

[73] Assignee: Rittal-Werk Rudolf Loh GmbH & Co. KG, Herborn, Germany

[21] Appl. No.: 09/142,752

[22] PCT Filed: Feb. 13, 1997

[86] PCT No.: PCT/EP97/00657

§ 371 Date: Sep. 14, 1998

§ 102(e) Date: Sep. 14, 1998

[87] PCT Pub. No.: WO97/34454

PCT Pub. Date: Sep. 18, 1997

[30] Foreign Application Priority Data

Mar. 13, 1996 [DE] Germany ................ 196 09 845

[51] Int. Cl.[7] ........................................... H02B 1/00
[52] U.S. Cl. ................ 361/676; 361/678; 361/687; 361/688; 361/690; 361/704; 174/16.1; 165/104.33; 165/185; 454/184
[58] Field of Search ........................ 361/676, 678, 361/605, 724, 690, 695; 174/16.1, 16.2; 165/104.33, 104.34, 185; 454/184, 185, 186

[56] References Cited

U.S. PATENT DOCUMENTS

| | | | |
|---|---|---|---|
| 3,120,166 | 2/1964 | Lyman | 454/184 |
| 5,467,250 | 11/1995 | Howard et al. | 361/696 |
| 5,544,012 | 8/1996 | Koike | 361/695 |
| 5,657,641 | 8/1997 | Cunningham et al. | 361/691 |
| 5,801,331 | 9/1998 | Zachrai | 361/605 |

*Primary Examiner*—Leo P. Picard
*Assistant Examiner*—Boris Chervinsky
*Attorney, Agent, or Firm*—Pauley Petersen Kinne & Fejer

[57] ABSTRACT

A cooler which can be fitted on a rear wall or a side wall or a door of a switching cabinet and can be connected thereto via an intake and an inlet aperture of an internal circuit. According to the invention, rain and dustproofing is improved because alongside a central ventilation shaft open at the top, the cooler housing has vertical ventilation chambers open at the top as part of an external circuit hermetically separated from the internal circuit, the top of the switching cabinet and cooler housing is covered by a roofing component spaced therefrom which projects on all sides beyond the control box and the cooler housing and leaves a peripheral ventilation slot opening downwards. The roofing component is divided by two partitions into three chambers which communicate with the ventilation shaft and both ventilation chambers in the cooler housing.

12 Claims, 2 Drawing Sheets

COOLER FOR FITTING TO THE REAR OR SIDE WALL OR THE DOOR OF A SWITCHING CABINET

BACKGROUND OF THE INVENTION

1. Field of the Invention

This invention relates to a cooling device, which can be installed in place of a rear wall, lateral wall or door of a switchgear cabinet and which can be brought in connection with the rear wall, the lateral wall or the door via an inlet opening and an outlet opening of an interior cycle.

2. Description of Prior Art

Such cooling devices are only laid out as heat exchangers and the separation between the interior air circulation cycle and the exterior air circulation cycle always presents difficulties. If this separation is not complete, the entry of moisture into the switchgear cabinet cannot always be unambiguously prevented. These difficulties increase considerably if the switchgear cabinet with the cooling device is placed in the open, since protection against rain and dirt particles is added.

SUMMARY OF THE INVENTION

It is one object of this invention to considerably improve protection of the heat exchanger of a cooling device of the type mentioned against condensation water, rain and dirt particles.

In accordance with this invention this object is attained with a cooling device housing that has, besides a central ventilating shaft which is open at the top, laterally thereof vertical ventilating chambers, open at the top, of an exterior cycle which is hermetically separated from the interior cycle. The top of the switchgear cabinet and the cooling device housing is covered by a roof element at a distance therefrom, which projects past the switchgear cabinet and the cooling device housing on all sides and leaves a ventilating slit, which is open toward the bottom, on all sides. The roof element is divided into chambers by separating sheet metal panels, which are in contact with the ventilating shaft and the two ventilating chambers of the cooling device housing. The roof element provides sufficient protection from rain and dirt particles and with the divided chambers the roof element is included in the ventilating cycle.

In accordance with a further embodiment, the rain protection can still be improved because the roof element has a circumferential edge which is angled downward and which partially extends into the area of the lateral walls of the switchgear cabinet and the cooling device housing. The rainwater drips off easier because the roof element has a horizontally oriented cover plate which makes a transition into the edge via inclined downward extending transition sections, and the corners of the roof element are beveled in the area of the edge and of the transition sections.

An embodiment matched to the cross-sectional shape distinguished because a switchgear cabinet is rectangular in shape, the separating walls of the roof element are aligned symmetrically and parallel with the vertical center plane of the switchgear cabinet extending from the front to the rear of the switchgear cabinet, and extend from the rear of the cooling device housing as far as the front of the switchgear cabinet.

The formation of a circumferential ventilating slit is achieved in accordance with one embodiment because the roof element is connected by spacers with the top of the switchgear cabinet and/or the cooling device housing.

A complete uncoupling of the chambers of the roof element is achieved because the separating sheet metal plates are matched to the interior cross section of the roof element and are supported on the top of the switchgear cabinet and the cooling device housing.

BRIEF DESCRIPTION OF THE DRAWINGS

This invention will be explained in more detail by means of an exemplary embodiment represented in the drawings wherein.

DESCRIPTION OF PREFERRED EMBODIMENTS

Figure 1:
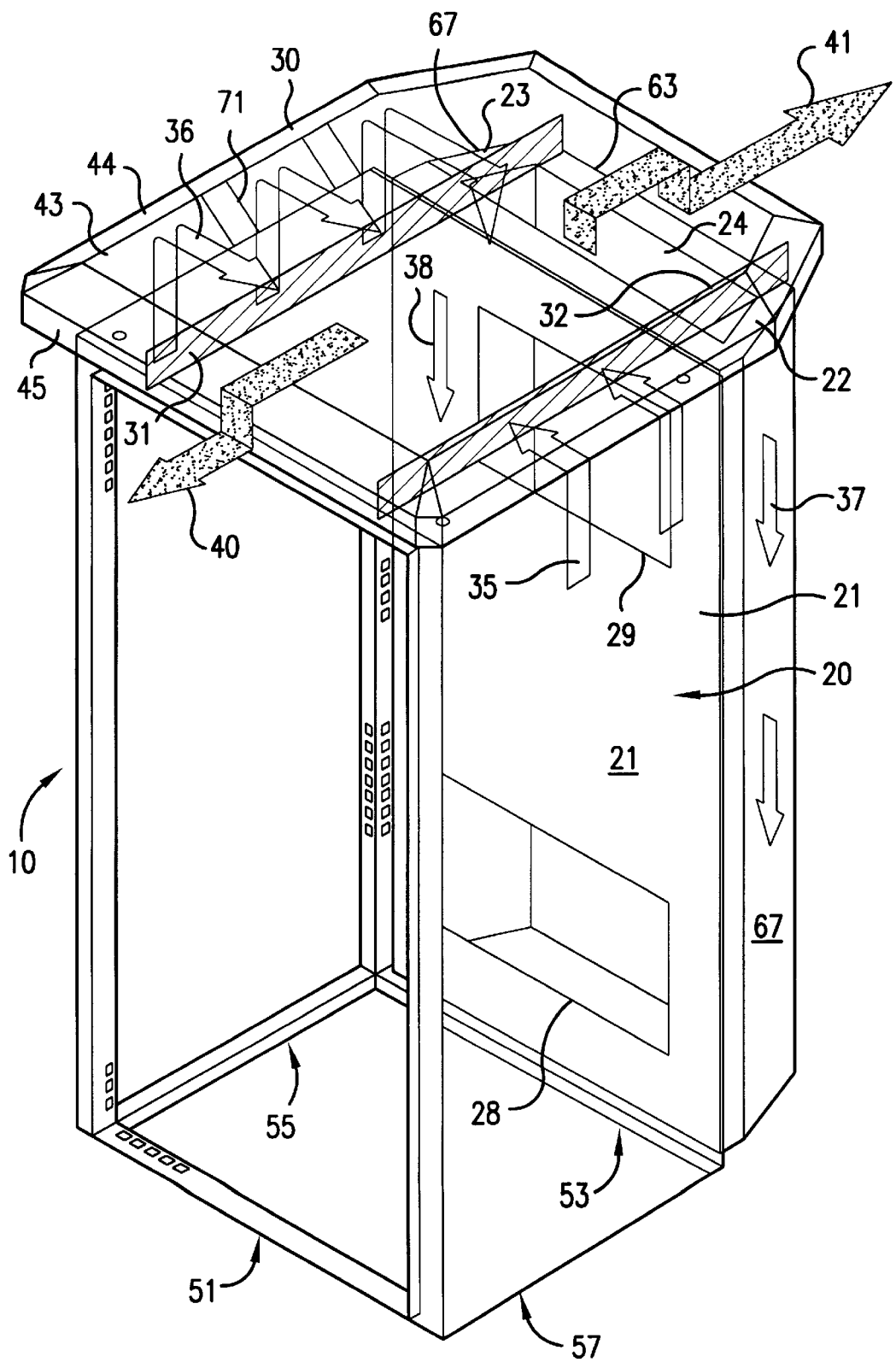
FIG. 1 is a schematic perspective view of a switchgear cabinet with a rear wall embodied as a cooling device and with a roof element placed thereon.

Only the frame of the switchgear cabinet 10 is shown in FIG. 1. The frame 10 defines a polyhedron having framing members for at least a front wall 51, a rear wall 53, and at least two lateral walls 55, 57. The rear of the frame is closed off by a cooling device, of which only the cooling device housing 20 is shown in the drawings, since the design of the cooling device is of no importance for this invention. The cooling device housing defines a polyhedron having at least a front wall 21, a rear wall 63, and at least two lateral walls 65, 67. The cooling device housing, which is trapezoidal in cross section, closes off the back of the frame flush on all sides by means of the front wall 21. However, the cooling device can also replace a lateral wall of the switchgear cabinet 10, or can itself be designed as a door. The cooling device is in communication with the interior of the switchgear cabinet via an inlet opening 28 and outlet opening 29. The cooling device housing 20 is divided into a central ventilating shaft 24 and, laterally thereof, into the two ventilating chambers 22 and 23. The ventilating shaft 24 which is assigned to the exterior cycle is hermetically separated from the ventilating chambers 22 and 23. The ventilating shaft 24 and the ventilating chambers 22 and 23 are open at the top.

A roof element 30 is fastened by means of spacers 71 on the top of the switchgear cabinet 10 and the cooling device housing 20. This roof element 30 comprises a horizontal cover plate 43. which makes a transition into a downward angled edge 45 via inclined, downward extending transition sections 44. The roof element 30 projects past the switchgear cabinet 10 and the cooling device housing 20 on all sides and constitutes an all around ventilating slit which is open toward the bottom.

Figure 2:
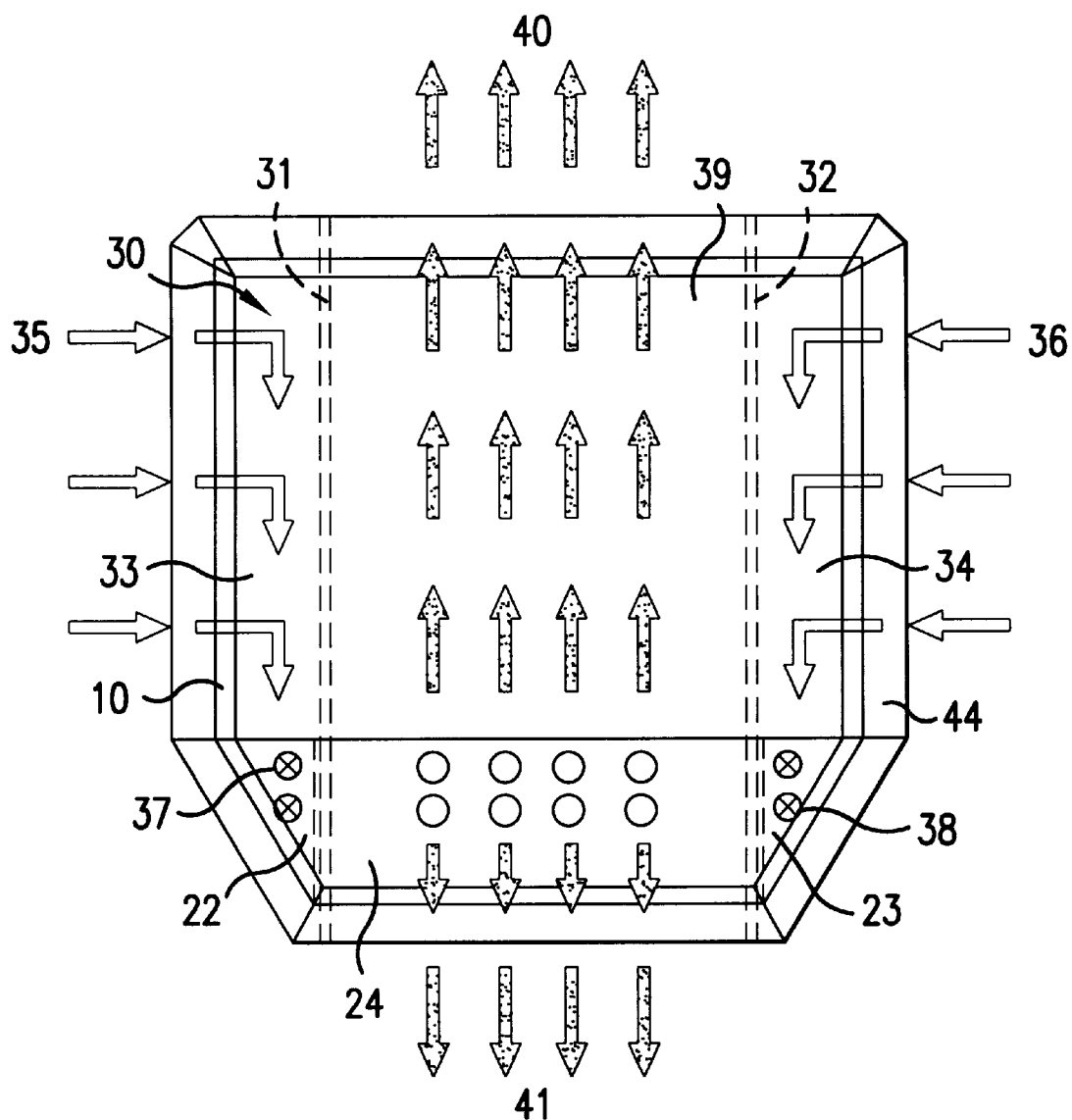
FIG. 2 is a schematic top view of the roof element with the chambers and the ventilating paths.

As the top view in accordance with FIG. 2 shows, the interior of the roof element 30 is divided into three chambers 33, 34 and 39 by the two separating walls 31 and 32. In the exemplary embodiment the separating walls 31 and 32 extend from the front of the switchgear cabinet 10 to the rear of the cooling device housing 20 and are arranged in such a way that the chamber 33 communicates with the ventilating chamber 22, the chamber 34 with the ventilating chamber 23 and the chamber 39 with the ventilating shaft 24. The air flowing out of the ventilating shaft 24 can exit via the chamber 39 of the roof element 30 at the front of the switchgear cabinet 10 and at the rear of the cooling device housing 20 via the ventilating slit, as shown by the arrows 40 and 41.

Fresh air is aspirated at both sides of the switchgear cabinet 10, as indicated by the arrows 35 and 36. This fresh air reaches the chambers 33 and 34 via the ventilating slit and then the ventilating chambers 22 and 23 of the cooling device, as indicated by the arrows 37 and 38.

The separating walls 31 and 32 extend parallel to each other and are located symmetrically with respect to the vertical center plane of the switchgear cabinet 10, which extends from the front to the rear, as shown in FIG. 2. The edge 45 of the roof element 30 partially extends into, or covers, the area of the lateral walls of the switchgear cabinet 10 and the cooling device housing 20, for better protection from rain and dust.

The cross-sectional shape of the switchgear cabinet and the cooling device can also be designed differently. The division of the roof element 30 by the separating walls 31 and 32 into the chambers 33, 34 and 39 always must be such that they are connected, separated from each other, with the ventilating chambers 22 and 23 and the ventilating shaft 24.

Depending on its use, the ventilating shaft 24 can also be used as an aspirating shaft, and the flow direction in the ventilating chambers 22 and 23 can also be directed from the bottom to the top. Again, this is a function of the cycle(s) of the switchgear cabinet.

We claim:

1. A switch gear cabinet comprising:
   a) a cabinet frame defining space for four vertical walls including a front, a rear, and first and second lateral walls, and defining a horizontal top and bottom of the cabinet,
   b) a cooling device installed as one of the vertical walls of the switchgear cabinet,
      the cooling device having a polyhedral housing (20) having a front wall, a rear wall, and first and second side walls enclosing a central ventilating shaft (24) open at a top thereof, and lateral to the ventilating shaft at least two vertical ventilating chambers (22, 23) open at the top;
   c) a roof element covering the top of the switchgear cabinet (10) and the cooling device housing (20),
      the roof element (30) being spaced at a distance therefrom, the roof element projecting past the switchgear cabinet (10) and the cooling device housing (20) on all sides and forming a ventilating slit open toward the cabinet bottom on all sides, and the roof element (30) being divided into at least three chambers (33, 34, 39) by at least two separating walls (31, 32), the chambers communicating with the ventilating shaft (24) and the two ventilating chambers (22, 23) of the cooling device housing (20), respectively; whereby the central shaft and the lateral chambers are hermetically separated.

2. The switchgear cabinet in accordance with claim 1, wherein the roof element (30) has a circumferential edge (45) angled downward and which partially extends into, and covers, an area of the lateral walls of the switchgear cabinet (10) and the cooling device housing (20).

3. The switchgear cabinet in accordance with claim 2, wherein the switchgear cabinet frame (10) is a rectangular faced polyhedron and the separating walls (31, 32) of the roof element (30) are aligned symmetrically and parallel with a vertical center plane of the switchgear cabinet (10) and the separating walls extend from a rear wall of the cooling device housing (20) to the opposing parallel wall of the switchgear cabinet (10).

4. The switchgear cabinet in accordance with claim 3, wherein the roof element (30) is connected by spacers with at least one of the top of the switchgear cabinet frame (10) and the cooling device housing (20).

5. The switchgear cabinet in accordance with claim 4, wherein the roof element (30) has a horizontally oriented cover plate (43) which makes a transition into the circumferential edge (45) via a plurality of inclined downward extending transition sections (44).

6. The switchgear cabinet in accordance with claim 5, wherein corners of the roof element (30) are beveled in an area of the circumferential edge (45) and of the transition sections (44).

7. The switchgear cabinet in accordance with claim 6, wherein the separating walls (31, 32) are matched to an interior cross section of the roof element (30) and are supported on the top of the switchgear cabinet (10) and the cooling device housing (20).

8. The switchgear cabinet in accordance with claim 1, wherein the switchgear cabinet frame (10) is a rectangular faced polyhedron and the separating walls (31, 32) of the roof element (30) are aligned symmetrically and parallel with a vertical center plane of the switchgear cabinet (10) and the separating walls extend from a rear wall of the cooling device housing (20) to an opposing parallel wall of the switchgear cabinet (10).

9. The switchgear cabinet in accordance with claim 1, wherein the roof element (30) is connected by spacers with at least one of the top of the switchgear cabinet frame (10) and the cooling device housing (20).

10. The switchgear cabinet in accordance with claim 1, wherein the roof element (30) has a horizontally oriented cover plate (43) which makes a transition into a circumferential edge (45) via a plurality of inclined downward extending transition sections (44).

11. The switchgear cabinet in accordance with claim 10, wherein corners of the roof element (30) are beveled in an area of the circumferential edge (45) and of the transition sections (44).

12. The switchgear cabinet in accordance with claim 1, wherein the separating walls (31, 32) are matched to an interior cross section of the roof element (30) and are supported on the top of the switchgear cabinet (10) and the cooling device housing (20).

* * * * *